(12) United States Patent
Lu

(10) Patent No.: US 8,480,254 B2
(45) Date of Patent: Jul. 9, 2013

(54) MOLDED REFLECTIVE STRUCTURES FOR LIGHT-EMITTING DIODES

(75) Inventor: Bing Lu, Union, KY (US)

(73) Assignee: Ticona, LLC, Florence, KY (US)

( * ) Notice: Subject to any disclaimer, the term of this patent is extended or adjusted under 35 U.S.C. 154(b) by 147 days.

(21) Appl. No.: 13/086,862

(22) Filed: Apr. 14, 2011

(65) Prior Publication Data

US 2012/0262925 A1    Oct. 18, 2012

(51) Int. Cl.
 *F21V 21/00*    (2006.01)

(52) U.S. Cl.
 USPC ...... 362/249.02; 362/245; 362/235; 362/231; 362/84; 257/98; 257/100; 257/88

(58) Field of Classification Search
 USPC ......... 362/249.02, 235, 244, 231, 84; 257/88, 257/98, 100
 See application file for complete search history.

(56) References Cited

U.S. PATENT DOCUMENTS

| | | | |
|---|---|---|---|
| 4,753,980 A | | 6/1988 | Deyrup |
| 4,859,732 A | | 8/1989 | Minnick |
| 4,999,055 A | | 3/1991 | Holtzen et al. |
| 5,015,942 A | * | 5/1991 | Kolanko ...................... 323/315 |
| 5,256,787 A | | 10/1993 | Borzatta et al. |
| 5,707,437 A | | 1/1998 | Niedenzu et al. |
| 5,965,261 A | | 10/1999 | Webster |
| 6,197,873 B1 | | 3/2001 | Miyata et al. |
| 6,236,061 B1 | | 5/2001 | Walpita |
| 6,878,972 B2 | * | 4/2005 | Waalib-Singh et al. ........ 257/98 |
| 7,381,996 B2 | * | 6/2008 | Hsin Chen ..................... 257/100 |
| 7,709,568 B2 | | 5/2010 | Bersted et al. |
| 7,999,280 B2 | * | 8/2011 | Kim et al. ......................... 257/99 |
| 8,070,316 B2 | * | 12/2011 | Urano et al. ............. 362/249.02 |
| 8,288,793 B2 | * | 10/2012 | Kim et al. ......................... 257/99 |
| 2003/0178221 A1 | | 9/2003 | Chiu et al. |
| 2004/0156213 A1 | | 8/2004 | Lodhie |
| 2005/0043483 A1 | | 2/2005 | Kim et al. |
| 2005/0118393 A1 | | 6/2005 | Corcoran et al. |
| 2006/0230553 A1 | | 10/2006 | Thullen et al. |
| 2007/0213458 A1 | | 9/2007 | Topoulos |
| 2010/0032702 A1 | * | 2/2010 | Lahijani ......................... 257/98 |
| 2010/0200882 A1 | | 8/2010 | Kotani et al. |

FOREIGN PATENT DOCUMENTS

| | | |
|---|---|---|
| EP | 0 684 648 A2 | 11/1995 |
| JP | 55027335 A | 2/1980 |
| JP | 11087780 A | 3/1999 |

(Continued)

OTHER PUBLICATIONS

Notification of Transmittal of the International Search Report and Written Opinion, dated Oct. 8, 2012, 14 pages.

*Primary Examiner* — Ali Alavi
(74) *Attorney, Agent, or Firm* — Dority & Manning PA

(57) ABSTRACT

The present disclosure is directed to a molded reflective structure for a light source, which may be a light-emitting diode ("LED"). The structure includes a reflector which defines a cavity therein. The cavity is surrounded by at least one reflective side wall, and has a greatest dimension of less than about 50 mm. The at least one reflective side wall further has an initial reflectance at 460 nm of greater than about 85% and an initial whiteness index of greater than about 80. The reflector is made from a thermoplastic polymer composition that contains a material such that the at least one reflective side wall absorbs light in the ultraviolet and violet region of the electromagnetic spectrum and re-emits light in the blue region.

15 Claims, 2 Drawing Sheets

FOREIGN PATENT DOCUMENTS

| | | |
|---|---|---|
| JP | 2003124521 A | 4/2003 |
| JP | 2005038661 A | 2/2005 |
| WO | WO 02/052615 A2 | 7/2002 |
| WO | WO 03/085029 A1 | 10/2003 |
| WO | WO 2008/002362 A1 | 1/2008 |
| WO | WO 2010/049531 A1 | 5/2010 |

* cited by examiner

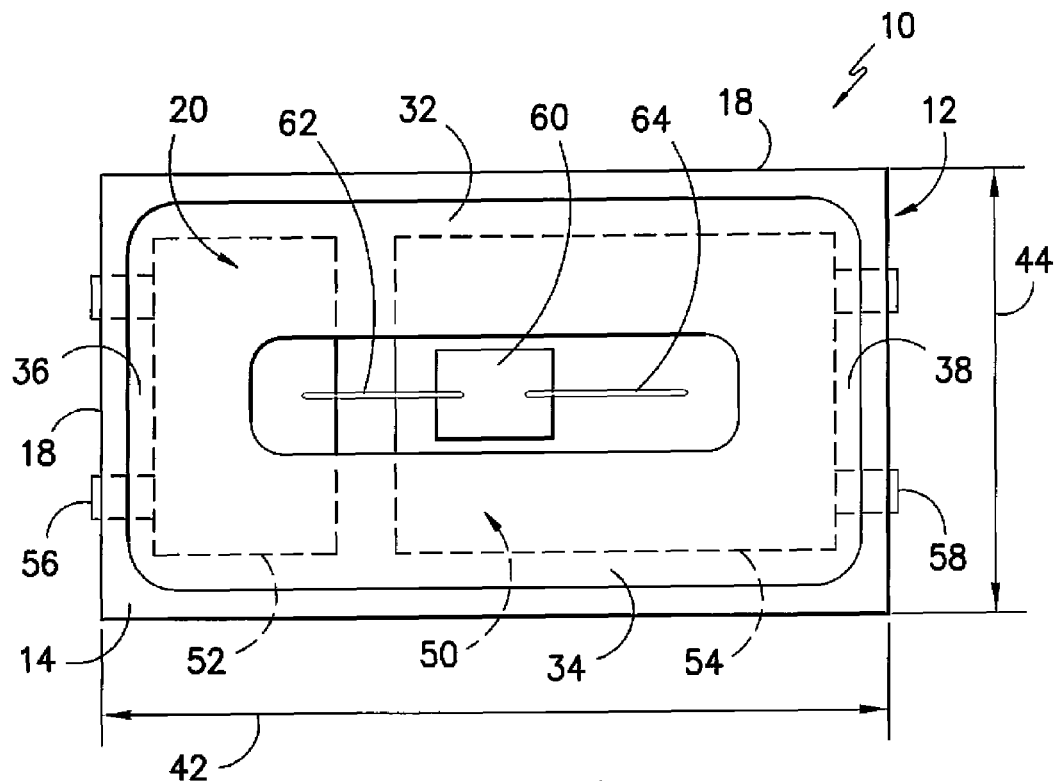
FIG. -1-
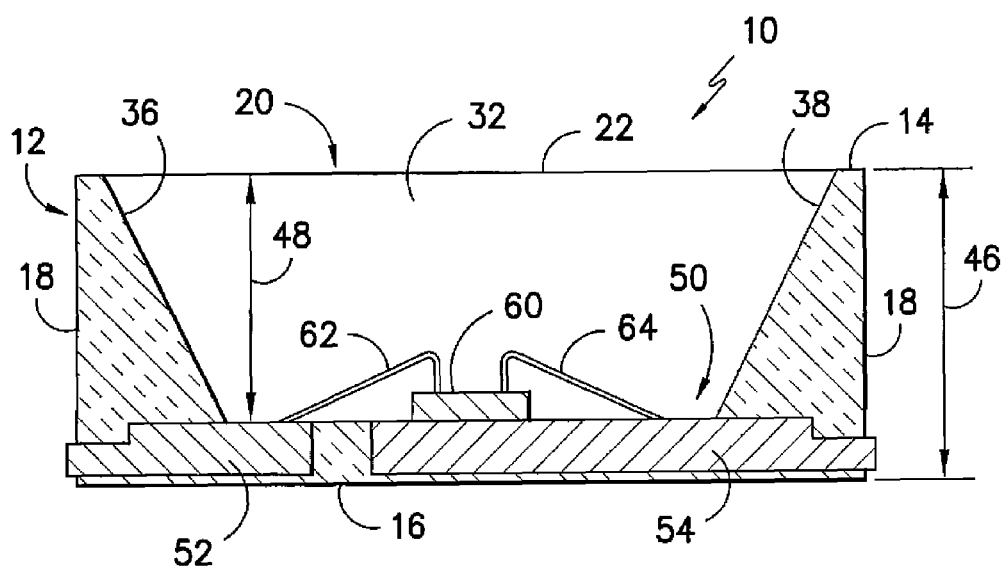
FIG. -2-

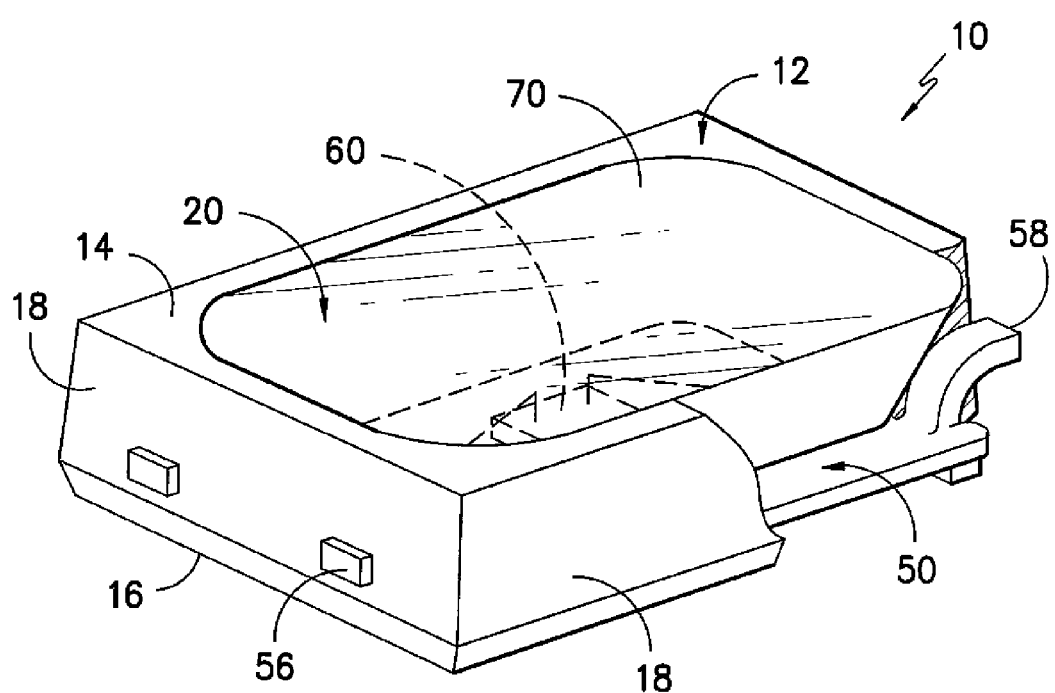
FIG. -3-

MOLDED REFLECTIVE STRUCTURES FOR LIGHT-EMITTING DIODES

BACKGROUND

Light-emitting diodes, commonly called LEDs, continue to increase in popularity as a light source for use in many and diverse applications. The demand for LEDs has grown rapidly, especially in the last five years. LEDs are being used as light sources in numerous applications due to their many advantages over conventional light sources. LEDs generally consume significantly less power than incandescent and other light sources, require a low voltage to operate, are resistant to mechanical shock, require low maintenance, and generate minimal heat when operating. As a result, LEDs are displacing incandescent and other light sources in many uses and have found applications, for instance, as traffic signals, large area displays, interior and exterior lighting, cellular telephone displays, digital clock displays, displays for consumer appliances, flashlights, and the like.

LEDs generally include a light-emitting diode mounted on a substrate that is electrically connected to a lead frame. The lead frame typically includes two terminals for connecting the LED to a power source. The light-emitting diode is a semiconductor device fabricated similar to the manner in which integrated circuits are produced. For instance, the light-emitting diode can be made from several layers of material that are sequentially deposited on a semiconductor substrate. The light-emitting diode within the semiconductor material includes an n-type material separated from a p-type material by an active layer. When a voltage is applied to the diode, positive charges or "holes" from the p-type material move towards the active layer while the negative charges or electrons from the n-type material also move towards the active layer in an opposite direction which produces light. In particular, the moving electrons release energy in the form of photons. Thus, one significant advantage of LEDs is that the devices produce light without a filament that will burn out over time. Thus, LEDs last a relatively long time, can be made to be very compact, and are very durable. Further, since a filament is not heated in order to produce light, LEDs are also very energy efficient.

After a light-emitting diode is fabricated, the semiconductor chip can be mounted adjacent to a reflector and connected to a lead frame. The lead frame can include an anode terminal and a cathode terminal for applying power to the assembly. In certain embodiments, the LED element located within the reflector can be sealed by a translucent or transparent resin. The transparent or translucent resin may serve as a lens for further enhancing the light that is emitted.

The reflector for the LED can also serve as the housing for the LED and is typically made from a molded polymeric resin. For example, the polymeric resin can be injection molded to form the housing and reflector. In one embodiment, the polymeric resin is injection molded over a lead frame for integrating the lead frame into the LED assembly.

The molded polymer resin used to form the reflector preferably possesses a particular combination of characteristics and properties. For instance, the polymer resin should be well suited to reflecting light at the wavelength at which the LED operates. Many LEDs, for instance, are designed to emit a white light. Thus, the polymer resin used to form the reflector should reflect a significant amount of light in the visible light region and particularly should reflect a significant percentage of light in the blue light wavelength range. Reflecting light in the blue wavelength range, for instance, has been found to significantly enhance the brightness of the LED, since LEDs that emit a white light emit a significant amount of light in the blue wavelength range. Increasing the reflectance of the reflector as high as possible minimizes loss of light when the LED is being operated.

The polymer resin used to form the reflector should also possess a high whiteness index. The whiteness index of the reflector indicates how well the reflector can reflect light over the entire visible light wavelength range (from about 400 nm to about 700 nm). In general, the higher the whiteness index of the material, the higher the reflectance of the material. A material possessing a white index value of 100, for instance, is considered a substantially perfect reflecting diffuser.

In addition to having excellent reflectance properties, the polymer resin used to form the reflector should also have good melt flow properties during injection molding of the parts. For instance, many LED structures are relatively small having dimensions that at times can be less than 1 millimeter. Reflectors can also have relatively complex shapes depending upon the particular application and the geometries of the lead plate in the LED. Thus, when the polymer resin is heated, the polymer should have sufficient flow properties in order to uniformly and repeatedly fill the interstices of the mold. The polymer resin should also have a stable viscosity that does not fluctuate during processing.

In addition to the above, the polymer resin used to form the reflector should have sufficient heat resistance including long term aging stability when either being soldered onto an adjacent part or when exposed to the operating temperatures of the LED. Many LED assemblies, for instance, are attached to circuit boards and other substrates using reflow oven welding processes that operate at temperatures up to about 260° C. The polymer resin should have good heat resistance properties to the reflow process and should not blister or otherwise deteriorate when subjected to the welding conditions.

During use, the LED also generates heat which is absorbed by the reflector. In the past few years, the amount of heat generated by the LED has increased as the LED element power has increased. When subjected to heat during welding and/or heat during use, the reflectance properties of the polymer resin should not deteriorate. In the past, for instance, exposure to high temperatures and/or repeated heating and cooling during use have caused polymer resins to yellow. Yellowing causes the whiteness index of the resin to lower. Yellowing is especially a problem for LEDs that emit blue light since yellow surfaces have a tendency to absorb light in the blue wavelength range.

In addition to the above, the reflector is generally a thin small part and requires satisfactory mechanical strength. Thus, reflectors should also have sufficient impact strength to avoid breakage during assembly of the LED and during use of the LED.

In U.S. Patent Publication No. 2007/0213458 entitled "Light-Emitting Diode Assembly Housing Comprising Poly (cyclohexanedimethanol terephthalate) Compositions", a reflector for an LED is disclosed that is made from a poly (cyclohexanedimethanol terephthalate) (hereinafter "PCT") composition. The '458 application, which is incorporated herein by reference, has made great advances in design and function of LEDs. The present disclosure, however, is directed to further improvements. In particular, the present disclosure is generally directed to a molded reflective structure. The structure includes a reflector that is formed from a composition that provides improved reflectance characteristics.

SUMMARY

In general, the present disclosure is directed to molded reflective structures for light sources. Such structures have improved reflectance characteristics.

As described in greater detail below, the structure of the present disclosure includes a reflector. In one embodiment, the reflector is formed so as to have a relatively high initial reflectance and initial whiteness index. The reflector is made from a thermoplastic polymer composition that contains a suitable material that provides improved reflectance characteristics. For example, the material contained in the thermoplastic polymer composition allows a reflective side wall of the reflector to absorb light in the ultraviolet and violet region of the electromagnetic spectrum and re-emit light in the blue region. Reflecting light in the blue region significantly enhances the brightness of a light source, such as an LED, associated with the reflector, since light sources that emit a white light emit a significant amount of light in the blue region.

The reflective side wall may have an initial reflectance at 460 nm of greater that about 85%, such as greater than about 90%, such as greater than about 93%, such as greater than about 95%. The initial reflectance at 460 nm is generally less than 103%, such as less than about 100%.

Additionally, the reflective side wall may have an initial whiteness index of greater than about 80, such as greater than about 86, such as greater than about 92, such as greater than about 95. The initial whiteness index is generally less than 100, such as less than about 98.

The thermoplastic polymer composition may contain any suitable polymer. For example, the composition may include a PCT resin. In addition, in some embodiments, the composition may include a suitable optical brightener, such as a benzoxazole.

The molded reflective structure in some embodiments includes a light source, such as an LED. The light source is positioned in a cavity of the reflector and connected to various components of the reflector. Further, the cavity may be occupied by a suitable translucent or transparent material.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which:

FIG. 1 is a top plan view of one embodiment of a molded reflective structure made in accordance with the present disclosure;

FIG. 2 is a side cross-sectional view of the molded reflective structure illustrated in FIG. 1; and FIG. 3 is a perspective view of the molded reflective structure illustrated in FIG. 1.

Repeat use of reference characters in the present specification and drawings is intended to represent the same or analogous features or elements of the present invention.

DETAILED DESCRIPTION

It is to be understood by one of ordinary skill in the art that the present discussion is a description of exemplary embodiments only, and is not intended as limiting the broader aspects of the present disclosure.

The present disclosure is directed to molded reflective structures for light sources. Such structures have improved reflectance characteristics.

Referring to FIGS. 1 through 3, a molded reflective structure 10 for a light source according to one embodiment of the present disclosure is shown. It should be understood that, while the structure 10 illustrated in FIGS. 1 through 3 is considered a top view structure, the present disclosure further applies to side view structures as well as any other suitable structures. The structure 10 includes a reflector 12. As shown, the reflector 12 has a top 14 and a bottom 16. At least one side wall 18, or a plurality of side walls 18, each extend from the top 14 to the bottom 16. For example, two, three, four, or more side walls 18 may extend from the top 14 to the bottom 16. The side walls 18 may further be connected together to generally form a periphery of the structure 10. Each side wall 18 may be linear, curvilinear, and/or have any suitable side wall portions at any suitable angles relative to other portions.

The top 14 of the reflector 12 defines a reflective cavity 20, which extends from a top surface 22 defining the top 14 of the structure 10 towards the bottom 16. The inner walls of the cavity 20, which surround and further define the cavity 20, have a depth sufficient for a light source, such as an LED, to be recessed within the cavity. Thus, the cavity 20 may surround a light source and serve to reflect light being emitted by the light source in an outward direction.

In general, the cavity 20 may have any suitable shape. For instance, the cavity 20 may be cylindrical, conical, parabolic, or any other suitable curved form. Additionally or alternatively, the walls of the cavity 20 may be parallel, substantially parallel, or tapered. Thus, it should be understood that the cavity 20 may be surrounded by any suitable number of walls, each wall having any suitable shape and/or orientation.

In one exemplary embodiment as shown in FIGS. 1 through 3, the cavity 20 may be surrounded by four side walls, including opposing side walls 32 and 34 and opposing side walls 36 and 38. Each of the walls may have generally smooth surfaces, thus defining a smooth inner surface of the cavity 20, or may have any suitable surface texture. At least one of the side walls 32, 34, 36, 38 may be a reflective side wall. Further, two, three, or four of the side walls 32, 34, 36, 38 may be reflective side walls. Additionally, it should be understood that any suitable number of side walls having any shape and/or orientation may be reflective side walls.

Each reflective side wall has a relatively high initial reflectance, and further has excellent reflectance stability. For example, each reflective side wall may have an initial reflectance at 460 nm of greater that about 85%, such as greater than about 90%, such as greater than about 93%, such as greater than about 95%. The initial reflectance at 460 nm is generally less than 103%, such as less than about 100%. Reflectance is measured according to ASTM Test Method 1331 using a spectracolormeter. During testing, a CIE D65 daylight illuminant is used at an angle of 10°.

Additionally, each reflective side wall has a relatively high initial whiteness index. For example, each reflective side wall may have an initial whiteness index of greater than about 80, such as greater than about 86, such as greater than about 92, such as greater than about 95. The initial whiteness index is generally less than 100, such as less than about 98. Whiteness index can be measured according to WI E313.

As mentioned, each reflective side wall also has excellent reflectance stability properties. For instance, after aging at 200° C. for four hours during the manufacturing process, the whiteness index of a reflective side wall can be at least about 70, such as at least about 72, such as at least about 74, such as even greater than about 75. The whiteness index after aging is lower than the initial whiteness index.

It should be understood that the present disclosure is not limited to the above disclosed ranges, and rather that any suitable initial reflectance, initial whiteness index, and/or whiteness index after aging is within the scope and spirit of the present disclosure.

As discussed, in some exemplary embodiments, a reflective side wall may have a parabolic shape. Additionally or alternatively, a reflective side wall may have a tapered surface that extends from the top surface 22 towards the bottom 16 of the reflector 12. For example, in some embodiments wherein the four side walls 32, 34, 36, and 38 are each reflective, at least two opposing reflective side walls may each have a tapered surface. In other words, reflective side walls 32 and 34 may have tapered surfaces, or reflective side walls 36 and 38 may have tapered surfaces, or all four reflective side walls 32, 34, 36, and 38 may have tapered surfaces. Tapering of a side wall may occur in an outward direction from the location of a light source within the cavity 20. Side walls that are not tapered, on the other hand, may be substantially parallel or have any other suitable orientation.

The reflector 12 according to the present disclosure has a length 42, a width 44, and a height 46. In accordance with the present disclosure, the greatest dimension of the reflector 12, such as the greatest of the length 42, width 44, and height 46, may be less than about 50 millimeters ("mm"), such as less than about 30 mm, such as less than about 20 mm, such as less than about 10 mm, such as less than about 8 mm. Additionally, the reflector 12 typically includes at least one dimension, such as width and/or height, that is less than 5 mm, such as less than 2 mm, such as even less than 1 mm. For example, the length 42 may, in some embodiments, be between about 1 mm and about 10 mm, such as between about 2 mm and about 8 mm, such as between about 2.5 mm and about 6 mm, such as between about 2.8 mm and about 5.6 mm. The width 44 may, in some embodiments, be in the range between about 0.25 mm and about 10 mm, such as between about 0.5 mm and about 8 mm, such as between about 1 mm and about 6 mm, such as between about 1.2 and about 5.2 mm. The height 46 may, in some embodiments, be in the range between about 0.25 mm and about 3 mm, such as between about 0.5 mm and about 2 mm, such as between about 0.6 and about 1.5 mm, such as between about 0.8 and about 1 mm. It should be understood, however, that the present disclosure is not limited to the above disclosed ranges, and rather that any suitable reflector 12 having any suitable length, width, and height is within the scope and spirit of the present disclosure.

Further, as mentioned above, the reflective cavity 20 has a depth 48. In general, the depth 48 is sufficient for a light source, such as an LED, to be recessed within the cavity. Thus, in some embodiments, the depth 48 is less than about 5 mm, such as less than about 3 mm, such as less than about 2 mm, such as less than about 1 mm, such as between about 0.2 mm and about 5 mm, such as between about 0.3 mm and about 3 mm, such as between about 0.5 mm and about 2 mm.

The reflector 12 of the present disclosure is made from a thermoplastic polymer composition which has excellent reflectance properties. In general, the composition contains a material such that each reflective side wall of the reflector 12 absorbs light in the ultraviolet and violet region of the electromagnetic spectrum, which may be between about 300 nanometers ("nm") and about 400 nm, and re-emits light in the blue region, which may be between about 410 nm and about 470 nm. By re-emitting light in the blue region, the reflector 12 of the present disclosure significantly enhances the brightness of a light source, such as an LED, contained within the reflector 12.

For example, in some embodiments, the polymer composition of the present disclosure contains a poly(1,4-cyclohexanedimethanol terephthalate) polymer, which is typically referred to as a "PCT" polymer. Poly(1,4-cyclohexanedimethanol terephthalate) is a polyester that contains repeat units from a dicarboxylic acid component and a glycol component. At least about 80 mol percent, more preferably at least about 90 mol percent, and especially preferably all of the dial repeat units are derived from 1,4-cyclohexanedimethanol and are of formula (I).

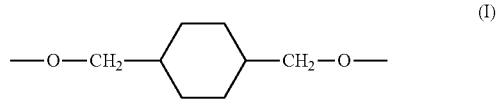

At least about 80 mol percent, more preferably at least about 90 mol percent, and especially preferably all of the dicarboxylic acid repeat units are derived from terephthalic acid and are of formula (II).

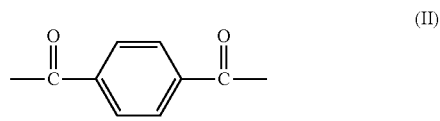

The PCT polymer may be present in the composition in an amount of at least about 20% by weight, such as in an amount of at least 30% by weight, such as in an amount of at least 40% by weight, such as in an amount of at least about 50% by weight, such as in an amount of at least about 60% by weight. The PCT polymer is generally present in an amount less than about 80% by weight, such as in an amount less than about 70% by weight. In one embodiment, the PCT polymer is present in an amount from about 20% by weight to about 60% by weight.

It should be understood, however, that the present disclosure is not limited to compositions including the above disclosed PCT polymer, and rather that any suitable thermoplastic polymer composition is within the scope and spirit of the present disclosure.

In some embodiments, the composition may include one or more white pigments. For example, white pigments may be present in amounts greater than 10% by weight, such as in amounts of at least about 15% by weight, such as in amounts of at least 20% by weight, such as in amounts of at least 25% by weight. Further, the white pigments may be present in the composition generally in an amount less than 60% by weight, such as in an amount less than about 50% by weight. The white pigments may generally increase the reflectance of the reflector 12. Examples of suitable white pigments that may be included in the composition include titanium dioxide, zinc oxide, white lead, aluminum oxide, barium sulfate, and the like.

The composition of the present disclosure may additionally or alternatively contain various other thermoplastic polymers. For example, in some embodiments, the other thermoplastic polymers may be present in an amount from about 1% to about 15% by weight. Other thermoplastic polymers that may be included include other polyester polymers, a liquid crystal polymer, or mixtures thereof.

In addition to the above, the composition may contain various other additives and ingredients. For instance, the composition may contain various thermal and oxidative stabilizers, ultraviolet light stabilizers, brighteners, and the like. In one particular embodiment, the composition may include a suitable optical brightener, such as a benzoxazole. For example, the composition may include benzoxazole, 2,2'-(1,2-ethenediyldi-4,1-phenylene)bis-, which has CAS Registry Number 1533-45-5, or another suitable benzoxazole. The optical brightener may further enhance the reflectance of the reflector 12.

In some embodiments, the thermoplastic polymer composition of the present disclosure is capable of forming reflectors 12 using melt flow processing techniques. For instance, the composition may be blow molded or injection molded to form the reflectors. Of particular advantage, the composition of the present disclosure may be formulated so as to have melt flow properties capable of forming hundreds of reflectors simultaneously.

Thus, in some embodiments, the composition may comprise a melt-mixed blend, wherein all of the polymeric components are well-dispersed within each other and all of the non-polymeric ingredients are well-dispersed in and bound by the polymer matrix, such that the blend forms a unified whole. Any melt-mixing method may be used to combine the polymeric components and non-polymeric ingredients. For example, in one embodiment, the polymeric components and the non-polymeric components may be added to a melt mixer, such as for example a single or twin-screw extruder, a blender, a kneader, or a Banbury mixer, either all at once through a single step addition, or in a stepwise fashion and then melt-mixed.

The reflector 12 according to the present disclosure further includes a lead frame assembly 50. The bottom 16 of the reflector 12 is attached to the lead frame assembly 50. For example, in one embodiment, the thermoplastic polymer composition from which the reflector is made may be injection molded over the lead frame assembly 50. In this manner, the lead frame assembly 50 and the reflector 12 may become integrated together. In other embodiments, however, the bottom 16 of the reflector 12 may be attached to the lead frame assembly 50 in any suitable manner. The assembly 50 includes a first lead frame member 52 and a second lead frame member 54. The frame members 52 and 54 define a respective first terminal or anode 56 and second terminal or cathode 58.

In exemplary embodiments, the structure 10 of the present disclosure further includes a light source, such as an LED 60. The LED 60 is configured to emit light when a current is fed through the structure 10, such as through the first and second terminals 56 and 58. For example, the LED 60 may be comprised of a semiconductor chip including multiple layers of materials. The LED 60 may generally include an n-type material layer and a p-type material layer, which form a p-n junction that can be connected to a voltage source. In one embodiment, for instance, the p-type layer may comprise doped gallium aluminum arsenide, while the n-type layer may comprise doped gallium arsenide. It should be understood, however, that any suitable configuration of the LED 60 is within the scope and spirit of the present disclosure.

The LED 60 includes an anode and a cathode (not shown) as is generally known in the art. The anode and cathode are connected to the first lead frame member 52 and second lead frame member 54, respectively. For example, as shown in FIGS. 1 through 3, a first bonding wire 62 and a second bonding wire 64 may connect the LED 60, such as the respective anode and cathode of the LED 60, to the first lead frame member 52 and second lead frame member 54.

As stated, the LED 60 is configured to emit light when a current is fed through the structure 10. In some embodiments, for example, the LED may be driven at a current of from about 10 milliamperes ("mA") to about 150 mA, such as from about 15 mA to about 100 mA, such as from about 20 mA to about 65 mA. In other embodiments, however, the LED 60 may be driven at a current of from about 150 mA to about 1500 mA.

The LED 60 may further be driven at a suitable voltage. For example, in some embodiments, the LED 60 may be driven at a voltage from about 3.0 volts ("V") to about 3.4 V. Additionally, the LED 60 may have a suitable intensity. For example, in some embodiments, the LED 60 may have an intensity from about 1800 millicandela ("mcd") to about 6000 mcd, such as from about 1800 mcd to about 2000 mcd or from about 4500 mcd to about 6000 mcd.

It should be understood, however, that the LED 60 of the present disclosure is not limited the above disclosed currents, voltages, or intensities, and rather that any LED 60 having any suitable current, voltage, and intensity is within the scope and spirit of the present disclosure.

In some embodiments, as illustrated in FIG. 3, the cavity 20 of the reflector 12 may be filled with, and thus occupied by, a clear material 70 such as a transparent material or a translucent material. For instance, the material 70 may be an epoxy or a silicone material. In one embodiment, the material 70 may act as a lens for the light being emitted by the LED 60. The lens may, for example, focus the light being emitted by the LED 60 in a single direction.

Molded reflective structures 10 made in accordance with the present disclosure can be used in numerous and different applications. For instance, the LED assemblies can be used in traffic signal lights, LCD displays, backlights, cellular telephones, automotive display lights, automotive headlamps, flashlights, interior lighting, streetlights, and in exterior lighting applications.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. A molded reflective structure for a light source comprising:
    a reflector having a top, a bottom, and at least one side wall extending from the top to the bottom, the top defining a reflective cavity that extends from a top surface towards the bottom, the reflective cavity being surrounded by at least one reflective side wall, the reflector having a greatest dimension of less than about 50 nm, the bottom being attached to a lead frame assembly, the lead frame assembly including a first lead frame member defining a first terminal and a second lead frame member defining a second terminal, the at least one reflective side wall having an initial reflectance at 460 nm of greater than about 85% and having an initial whiteness index of greater than about 80, the reflector being made from a thermoplastic polymer composition, the thermoplastic polymer composition being comprised of a poly(1,4-cyclohexanedimethanol terephthalate), the thermoplastic polymer composition containing a material such that the at least one reflective side wall absorbs light in the ultraviolet and violet region of the electromagnetic spectrum and re-emits light in the blue region.

2. A molded reflective structure as defined in claim 1, wherein the at least one reflective side wall has a parabolic shape.

3. A molded reflective structure as defined in claim 1, wherein the reflective cavity of the reflector includes four reflective side walls.

4. A molded reflective structure as defined in claim 3, wherein at least two opposing reflective side walls have a tapered surface that extends from the top surface towards the bottom of the reflector.

5. A molded reflective structure as defined in claim 1, wherein the reflective cavity has a depth of less than about 3 millimeters.

6. A molded reflective structure as defined in claim 1, wherein the reflective cavity has a depth of from about 0.5 millimeters to about 2 millimeters.

7. A molded reflective structure as defined in claim 1, wherein the thermoplastic polymer composition contains a benzoxazole.

8. A molded reflective structure as defined in claim 1, further comprising a light emitting diode, the light emitting diode including an anode connected to the first lead frame member and a cathode connected to the second lead frame member.

9. A molded reflective structure as defined in claim 8, wherein the cavity is occupied by a translucent or transparent material.

10. A molded reflective structure as defined in claim 8, wherein the light emitting diode is driven at a current of from about 10 mA to about 150 mA.

11. A molded reflective structure as defined in claim 8, wherein the light emitting diode is driven at a current of from about 150 mA to about 1500 mA.

12. A molded reflective structure as defined in claim 8, wherein the light emitting diode has an intensity of from about 1800 mcd to about 6000 mcd.

13. A molded reflective structure as defined in claim 1, wherein the reflector has a greatest dimension of less than about 10 mm.

14. A molded reflective structure as defined in claim 1, wherein the reflector has at least one dimension of less than about 5 mm.

15. A molded reflective structure as defined in claim 1, wherein the reflector has a length, a width and a height, the length being from about 2 mm to about 8 mm, the width being from about 0.5 mm to about 8 mm, and the height being from about 0.5 mm to about 2 mm.

* * * * *